United States Patent [19]
Kuroda

[11] Patent Number: 5,241,200
[45] Date of Patent: Aug. 31, 1993

[54] SEMICONDUCTOR MEMORY AND METHOD OF FABRICATING THE SAME

[75] Inventor: Hideaki Kuroda, Kanagawa, Japan
[73] Assignee: Sony Corporation, Tokyo, Japan
[21] Appl. No.: 872,101
[22] Filed: Apr. 22, 1992
[30] Foreign Application Priority Data
   May 2, 1991 [JP] Japan .................... 3-130422
[51] Int. Cl.$^5$ .................... H01L 29/06; H01L 29/78
[52] U.S. Cl. .................... 257/298; 257/905; 257/906
[58] Field of Search .................... 357/23, 13; 257/298, 257/908, 303, 306

[56] References Cited
U.S. PATENT DOCUMENTS

| | | | |
|---|---|---|---|
| 4,819,046 | 4/1989 | Misu | 357/23.13 |
| 4,831,424 | 5/1989 | Yoshida et al. | 357/23.13 |
| 4,980,741 | 12/1990 | Temple | 357/38 |
| 4,987,465 | 1/1991 | Longcor et al. | 357/23.13 |

Primary Examiner—Andrew J. James
Assistant Examiner—Stephen D. Meier
Attorney, Agent, or Firm—Hill, Steadman & Simpson

[57] ABSTRACT

A diffused layer is formed in a semiconductor substrate in a connecting region wherein a word line and a shunt thereof are connected to each other, and the word line is also connected to the diffused layer. A junction breakdown voltage between the diffused layer and the semiconductor substrate is not higher than the breakdown voltage of a gate insulating film and is not lower than a maximum voltage applied during a burn-in operation. For this reason, charges accumulated in the word line during a wafer process are easily discharged to the semiconductor substrate through the diffused layer. In addition, since the diffused layer connected to the word line is formed in the connecting region wherein the word line and the shunt thereof are connected to each other, an additional region for the diffused layer is not required. Therefore, variations in characteristics of a transistor, or degradation and breakdown of the gate insulating film can be prevented without a decrease in integration density.

2 Claims, 4 Drawing Sheets

SEMICONDUCTOR MEMORY AND METHOD OF FABRICATING THE SAME

BACKGROUND OF THE INVENTION

1. Field of the Invention

The present invention relates to a semiconductor memory in which a word line has a shunt and to a method of fabricating the same.

2. Description of the Prior Art

A word line of a semiconductor memory, i.e., a gate line of an access transistor, is generally formed by a polysilicon film doped with an impurity or a polycide film. However, such a word line has a relatively high resistance. For this reason, a method of forming a shunt made of an Al film or the like to the word line is used to decrease the delay of the word line.

FIG. 1 schematically shows a DRAM using the above method. In this DRAM, each memory cell is constituted by an access transistor 11 and a capacitor 12. One word line formed by a polycide film 13 or the like is connected to one column of a memory cell array, and a shunt formed by an Al film 14 or the like is connected to the polycide film 13 every predetermined connecting region 15.

One end of the polycide film 13 is connected to one diffused layer of a transistor (not shown) in a column decoder 16. A bit line formed by a polycide film 17 or the like is connected to one line of the memory cell array.

FIGS. 2A and 2B show a conventional DRAM having the arrangement shown in FIG. 1. In this conventional DRAM, the polycide film 13 extends on an element isolation $SiO_2$ film 21 in the connecting region 15, and a contact hole 23 is formed in an interlayer insulator 22 covering this polycide film 13.

The polycide film 17 formed by the same layer as that of the bit line and patterned into a square is brought into contact with the polycide film 13 through the contact hole 23. The polycide film 17 is covered with a BPSG film 24, and the Al film 14 is in contact with the polycide film 17 through a contact hole 25 formed in the BPSG film 24.

As shown in FIG. 3, according to another prior art, an Al film 14 may be in direct contact with a polycide film 13 without going through a polycide film 17.

Incidentally, charges are accumulated during a wafer process in the polycide film 13 which serves as the word line or Al film 14 which serves as the shunt of the word line. However, as described above, an end of the polycide film 13 is connected to only the diffused layer of the transistor in the column decoder 16.

The area of the diffused layer of the transistor in the column decoder 16 cannot be increased due to a limitation in a layout. Therefore, a resistance between the diffused layer and the semiconductor substrate is high, and charges accumulated in the polycide film 13 or the like are not easily discharged to the semiconductor substrate through the diffused layer.

For this reason, a large electric field is applied to the gate insulating film between the polycide film 13 and the semiconductor substrate, and carriers are injected from the semiconductor substrate and the diffused layer into the gate insulating film. As a result, the characteristics such as a threshold voltage of the transistor 11 are varied, or the gate insulating film is degraded and broken down. Therefore, according to the prior arts shown in FIGS. 2A, 2B, and 3, a highly reliable semiconductor memory is not always obtained.

SUMMARY OF THE INVENTION

According to the present invention, in a semiconductor memory, a diffused layer is formed in a semiconductor substrate in a connecting region wherein a word line and a shunt thereof are connected to each other, a junction breakdown voltage between the diffused layer and the semiconductor substrate is not higher than the breakdown voltage of a gate insulating film and is not lower than a maximum voltage applied during a burn-in operation, and the word line is connected to the diffused layer.

According to the present invention, in a semiconductor memory, since the junction breakdown voltage of the diffused layer connected to the word line is not higher than the breakdown voltage of the gate insulating film and than the maximum voltage applied during the burn-in operation, charges accumulated in the word line during a wafer process are easily discharged to the semiconductor substrate through the diffused layer. For this reason, a large electric field is not applied to the gate insulating film, and variations in characteristics of a transistor using the word line as its gate wiring line or degradation and breakdown of the gate insulating film can be prevented.

Furthermore, since the diffused layer connected to the word line is arranged in a connecting region wherein the word line and the shunt are connected to each other, an additional region for the diffused layer is not required.

As described above, in the semiconductor memory according to the present invention, since variations in characteristics of the transistor and degradation and breakdown of the insulating film are prevented without requiring an additional region, the reliability of the semiconductor memory can be increased without a decrease in integration density.

BRIEF DESCRIPTION OF THE DRAWINGS

FIGS. 2A and 2B show a prior art, in which FIG. 2A is a plan view thereof and

FIG. 2B is a side sectional view thereof along a line B—B in FIG. 2A;

FIGS. 4A and 4B show an embodiment of the present invention, in which

FIG. 4A is a plan view thereof and

FIG. 4B is a side sectional view thereof along a line B—B in FIG. 4A; and

DETAILED DESCRIPTION OF THE PREFERRED EMBODIMENT

Figure 1:
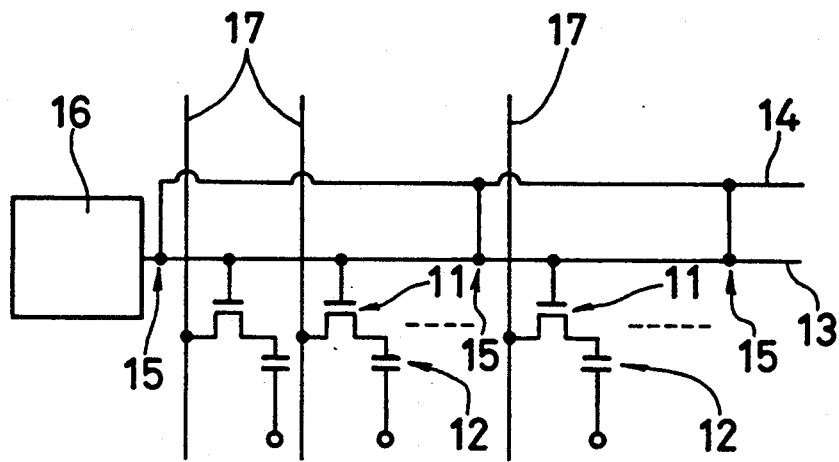
FIG. 1 is a circuit diagram schematically showing a DRAM to which the present invention can be applied.
Figure 3:
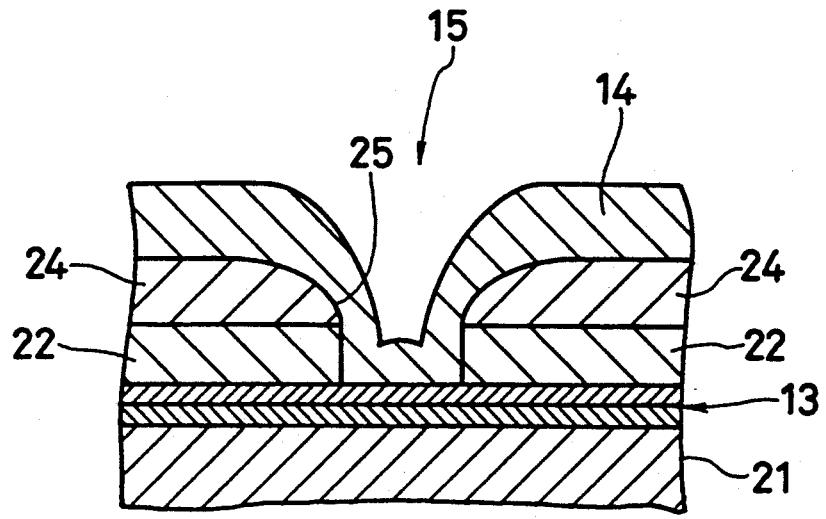
FIG. 3 is a side sectional view of another prior art.
Figure 2A:
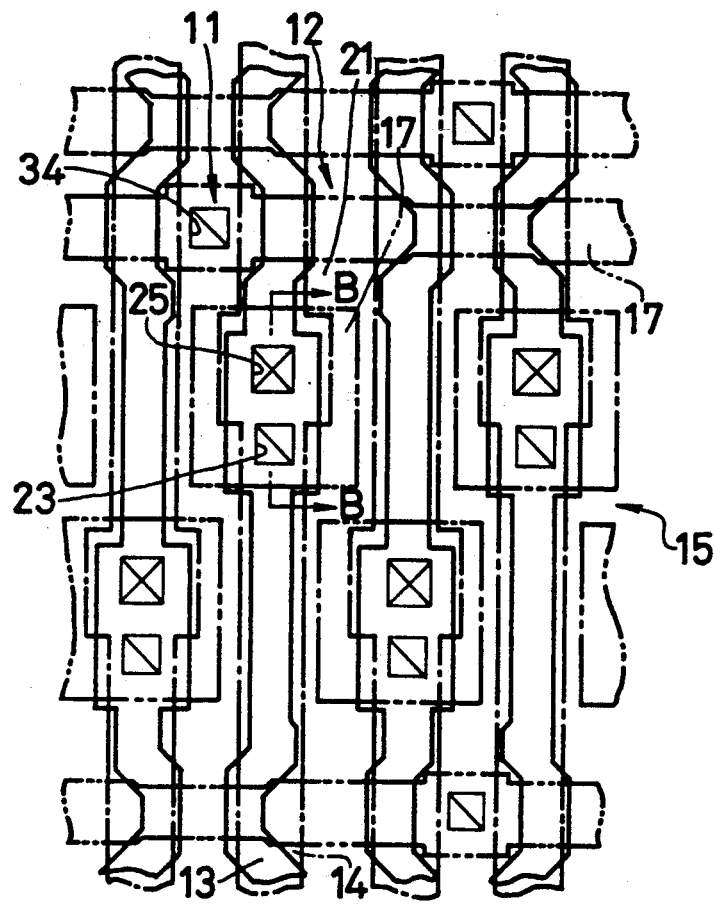
Figure 2B:
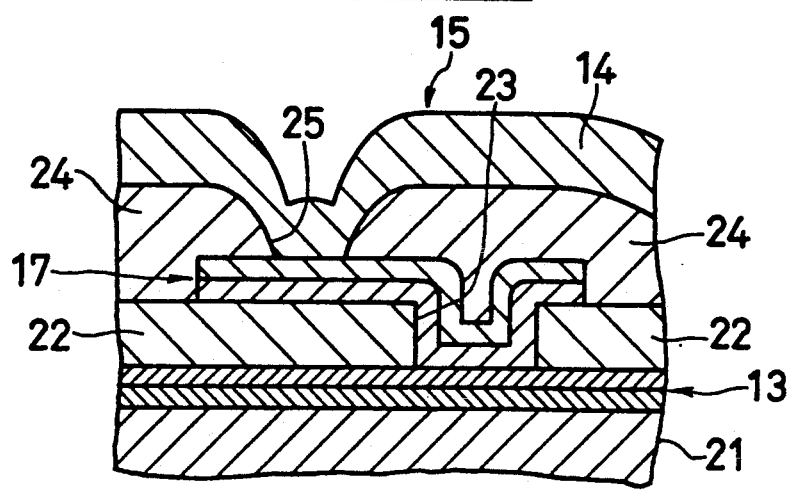
Figure 4A:
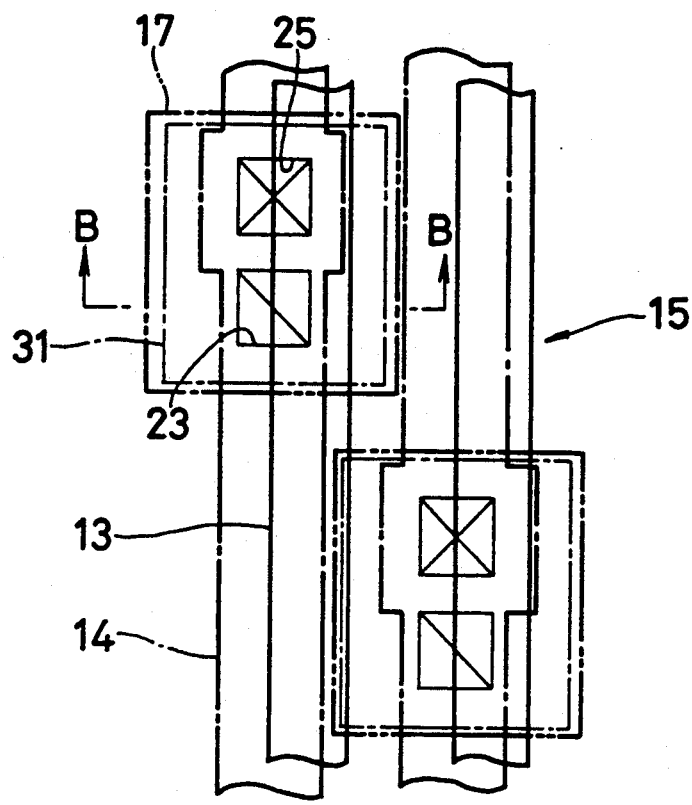
Figure 4B:
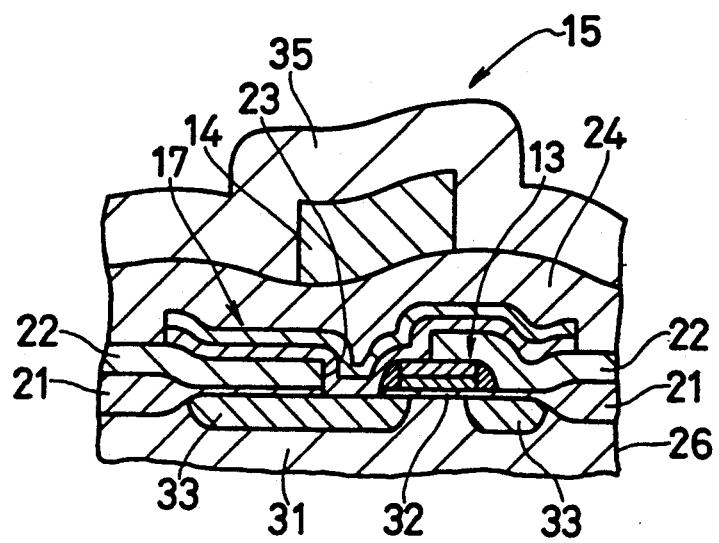
Figure 5:
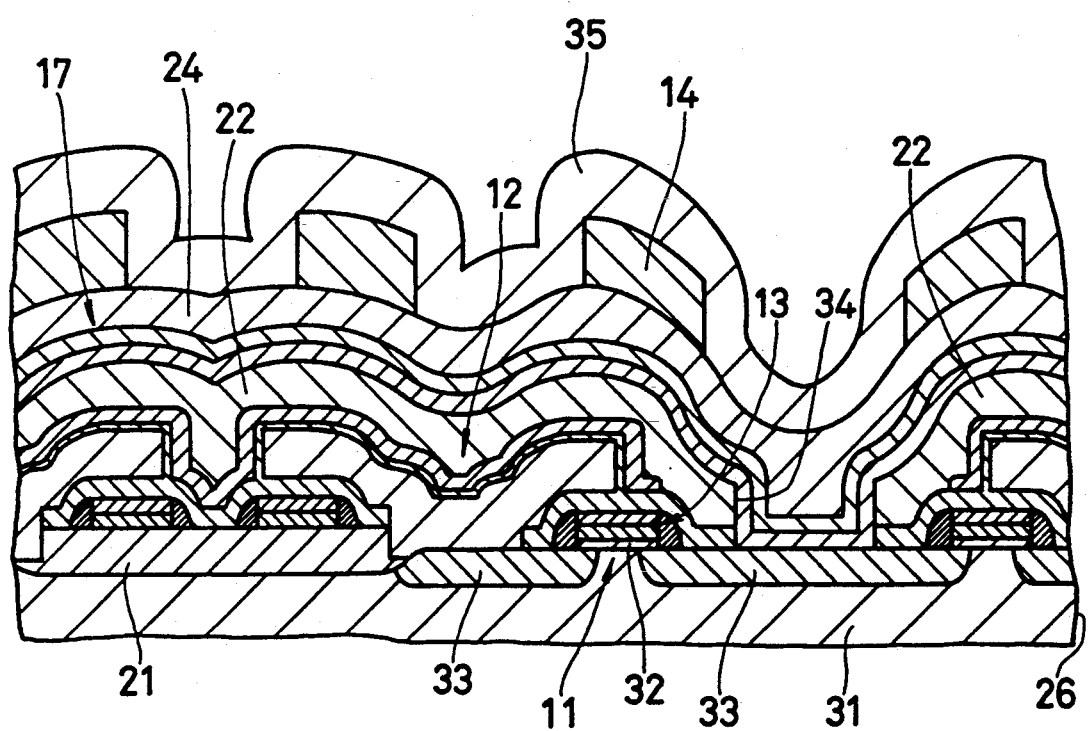
FIG. 5 is a side sectional view of a memory cell section according to the embodiment of the present invention.

An embodiment of the present invention applied to a stacked capacitor DRAM will be described below with reference to FIGS. 1, 4A, 4B, and 5.

A semiconductor memory according to this embodiment is fabricated as follows. An $SiO_2$ film 21 is formed in an element isolation region of a p-type Si substrate 26 by a LOCOS method. At this time, an active region 31 is formed in a connecting region 15 wherein a word line and a shunt thereof are connected to each other. An SiO₂ film 32 serving as a gate insulating film is formed on the surface of the active region 31 to have a thickness of about 200 Å.

Thereafter, ion implantation of boron is performed to the resultant structure at an energy of several tens to hundred and several tens keV and a concentration of $5 \times 10^{16}$ cm$^{-3}$ to 2 to $3 \times 10$ cm$^{-3}$ such that the impurity concentration of the Si substrate 26 contacting a diffused layer to be formed in the active region 31 of the connecting region 15 is controlled to set the junction breakdown voltage between the diffused layer and the Si substrate 26 to be about 10 to 15 V.

This ion implantation may be performed to only the connecting region 15. Alternatively, when there is no influence on characteristics of a transistor 11 or the like, the ion implantation may be performed to the entire surface of the Si substrate 26. Note that the lowest limit value of the junction breakdown, i.e., 10 V, is a maximum voltage applied during a burn-in operation, i.e., $2 \times Vcc \approx 10$ V (Vcc=5 V), and the highest limit value, i.e., 15 V, is the breakdown voltage of the SiO₂ film $32 \approx 15$ to 16 V (8 MV/cm).

A polycide film 13 constituted by a polysilicon film and a silicide film each having a thickness of about 1,000 Å is patterned to form a word line. Arsenic or phosphorus ions are implanted in the resultant structure using the polycide film 13 as a mask to form a diffused layer 33 in the active region 31. As described above, the transistor of the memory cell is completed.

Thereafter, a capacitor 12 constituting a memory cell is formed, and the capacitor 12, the polycide film 13 in the connecting region 15 and the like are covered with an interlayer insulator 22. Planarization may be performed using a PSG film or BPSG film as the interlayer insulator 22.

In the memory cell, a contact hole 34 for a bit line is formed in the interlayer insulator 22 and the like. At the same time, in the connecting region 15, a contact hole 23 extending between the diffused layer 33 and the polycide film 13 is formed in the interlayer insulator 22 and the like.

The polycide film 17 constituted by a polysilicon film having a thickness of about 1,500 Å and a silicide film having a thickness of about 1,000 Å is patterned to form a bit line which is in contact with the diffused layer 33 of the memory cell through the contact hole 34. At the same time, the polycide film 13 and the diffused layer 33 in the connecting region 15 are connected to each other in the contact hole 23 through the polycide film 17.

Thereafter, a BPSG film 24 is formed as an interlayer insulator, and a contact hole 25 reaching the polycide film 17 in the connecting region 15 is formed in the BPSG film 24. The resultant structure is annealed in a nitrogen atmosphere at a temperature of about 800° to 900° C. to planarize the BPSG film 24.

Thereafter, an Al film 14 is deposited by a sputtering method or the like and patterned to form a shunt of the word line. The Al film 14 is covered with a P-SiN film 35 formed by a plasma CVD method.

What is claimed is:

1. A semiconductor memory in which a word line has a shunt, wherein
   a diffused layer is formed in a semiconductor substrate in a connecting region wherein said word line and said shunt are connected to each other,
   a junction breakdown voltage between said diffused layer and said semiconductor substrate is not higher than a breakdown voltage of a gate insulating film and is not lower than a maximum voltage applied during a burn-in operation, and
   said word line is connected to said diffused layer through a conducting film formed above said word line and said word line is connected to said shunt via said conducting film.

2. A memory according to claim 1, wherein the junction breakdown voltage is about 10 to 15 V.

* * * * *